United States Patent [19]

Hosking

[11] Patent Number: 4,520,429

[45] Date of Patent: May 28, 1985

[54] DUAL-PATH CIRCUIT BOARD CONNECTOR WITH INTERNAL SWITCHING

[75] Inventor: Michael B. Hosking, Poway, Calif.

[73] Assignee: General Dynamics Corporation, Electronics Division, San Diego, Calif.

[21] Appl. No.: 563,087

[22] Filed: Dec. 19, 1983

[51] Int. Cl.³ .................... H01R 23/68; H05K 1/00; H01H 9/26

[52] U.S. Cl. .................... 361/413; 339/17 L; 339/17 LC; 339/17 LM; 339/17 M; 200/5 R; 200/5 A; 200/51.04

[58] Field of Search ............... 361/400, 413; 200/5 R, 200/51 R, 51.04, 51.09, 51.16, 5 A; 339/17 LM, 17 LC

[56] References Cited

U.S. PATENT DOCUMENTS 3,870,839 3/1975 Almich et al. .................... 200/5 A

*Primary Examiner*—R. L. Moses
*Assistant Examiner*—Tarick Basma
*Attorney, Agent, or Firm*—Brown, Martin & Haller

[57] ABSTRACT

A dual-path, multicontact connector for a printed circuit board includes two perpendicular groups of contacts and a plurality of internal switches which permit conductivity to be selectively established between one or more pairs of contacts or between either contact of each pair and an electrical circuit on the circuit board. Each contact of a contact pair is included in a respective group of contacts. The perpendicular arrangement of the contact groups allows one group of contacts on the dual-path connector to engage corresponding contact groups on adjacent abutting dual-path connectors. Selective operation of the internal switches in a series of abutting connectors can provide alternate conductive pathways to electrical circuits on any board through the contacts of one or more adjacent connectors.

14 Claims, 13 Drawing Figures

DUAL-PATH CIRCUIT BOARD CONNECTOR WITH INTERNAL SWITCHING

BACKGROUND OF THE INVENTION

The present invention relates to electrical circuit board connecting devices, and more particularly, to an electrical circuit board connector having two sets of contact pins and a plurality of internal switches which permit conductivity to be selectively established between pairs of contacts or between either contact of a contact pair and an electrical circuit on the circuit board.

In general, a printed circuit board is a device which provides a means of mounting and interconnecting conventional electric circuits on insulating substrates which form the boards. As is known, a printed circuit board consists of an insulating carrier upon which a conductive metal pattern is laid out to make desired connections between circuits which are mounted on the board. The conductive patterns are called lands. Typically, a connector is mounted on a printed circuit board for joining electrical circuits on the board with other circuits which reside in a location off of the board. Such connectors are customarily of the rack-and-panel type, and the circuit boards on which they are mounted are typically slidably held in a chassis.

Most printed circuit board connectors conventionally carry a plurality of contacts of the pin-and-socket type in a connector plug. The plug generally has a rectangular configuration and is attached to an edge of the board in order to mate with a corresponding receptacle mounted in a rack on the supporting chassis.

One drawback of existing printed circuit board connectors is that their contacts are generally capable of being engaged only by one other set of contacts in a receptacle which mates physically with the circuit board connector. Thus, when it is desired to change the circuit connections which a connector provides for electric circuits mounted on a board, one or more pins on the receptacle with which the connector mates must be rewired to provide the desired alternate routings. It is evident that provision of a set of contacts in addition to that already carried by a conventional circuit board connector, together with a means for selectively providing the electric circuits mounted on the circuit board with connections to one or the other of the sets of contacts, would expeditiously and effectively accomplish circuit linkage re-routing without the need for re-wiring. Moreover, if the switching means is also provided with a capability of establishing conductivity between selected ones of the two groups of contacts on the connector, then one or more electrical circuits on the board can be accessed through the connector of an adjacent board having a group of contacts which engage one of the groups of contacts on the first connector.

Heretofore, the design of conventional circuit board connectors has not lent itself well to selectively switching and routing electrical circuit paths between a plurality of adjacent connectors. However, because of the added switching capability which such a function would provide to a system including a plurality of adjacent printed circuit boards, it would be desirable to have a connector with an internal switching apparatus for use in routing signal paths through itself to an adjacent connector.

SUMMARY OF THE INVENTION

In the illustrated embodiments of my invention, a printed circuit board connector has a plurality of connector contacts which are engaged by other contacts to form electrical connections, with the contacts carried on a connector body. Mounted internally to the connector body is a switching apparatus which is connected to the connector contacts and to electrical circuits on the printed circuit board for selectively providing connections between pairs of the connector contacts and between electrical circuits carried on the circuit board and the contacts.

Preferably, the switching apparatus has a plurality of individual switches, each having respective connections to a respective electrical circuit, to a first contact, and to a second contact, and includes means for selectively providing conductivity between any two of its connections. Further, the contacts of the connector form two predetermined groups of contacts, with each contact of each group connected to a respective switch. The switch provides the connector with an improved switching and routing capability, enabling respective contacts in one group to form connections with contacts of the other group of contacts or with respective electrical circuits. When the connector is positioned adjacent to another printed circuit board connector also having two sets of contacts, one of which is positioned to engage one group of contacts on the first connector, connections to electrical circuits on either board can be selectively switched and routed through the adjacent connectors as desired.

Accordingly, it is the primary object of the present invention to provide an improved printed circuit board connector having two sets of contacts and a switching apparatus which can selectively provide connections between contacts of separate groups or between contacts and electrical circuits on the circuit board.

Another object of the present invention is to provide a printed circuit board connector having two or more sets of contacts to afford selectively alternate paths for connection to electrical circuits on a printed circuit board.

Another object of the present invention is to provide a printed circuit board connector which can be mounted on a printed circuit board to selectively route connections between its own contacts and contacts carried on another printed circuit board connector or electrical circuits carried on another printed circuit board.

It is a further object of the present invention to provide a printed circuit board connector mounted on a printed circuit board having electrical circuits, which can selectively switch connections between those electrical circuits and the contacts of an adjacent printed circuit board connector.

These and other objects of the invention will become more readily apparent from the ensuing description of the preferred embodiments when taken together with the drawings.

DESCRIPTION OF THE PREFERRED EMBODIMENTS

Figure 1:
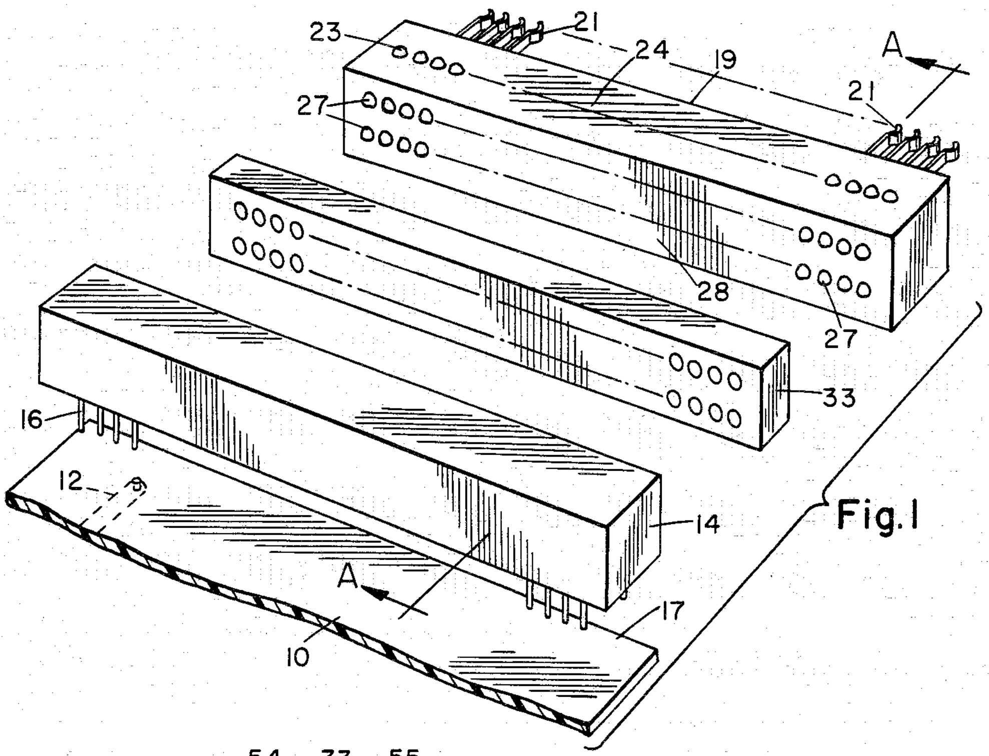
FIG. 1 is an exploded assembly view of a first embodiment of the dual-path connector of the invention which includes internal solid-state switching circuitry.

A first embodiment of the connector of the invention is illustrated at FIG. 1 wherein a conventional printed circuit board 10 has a plurality of conventional circuit lands, one of which is indicated by 12, which are connected to respective electrical circuits on the board. As is known in the art, such a printed circuit board typically has a rectangular connector of the rack-and-panel type mounted adjacent one of its edges, which provides electrical linkage between circuits on the circuit board and a rack of contacts with which the connector is brought into electrical contact. However, conventional circuit board connectors generally provide only a single array of contacts which are oriented in the direction necessary to engage corresponding contacts in the rack connector.

In the connector of the invention, however, two sets of contacts are provided so that circuits on a printed circuit board can be selectively connected to more than one set of circuit connections. The connector of the invention includes a connector rear block 14 which supports a plurality of circuit connection pins 16 which are connected to respective lands on the circuit board 10. The rear block has a rectangular configuration and is mounted on the circuit board 10 along and in parallel alignment with one of its edges 17.

A rectangularly-shaped connector front block 19 carries a plurality of conventionally mounted paddle contacts 21 which are disposed in a linear array for engagement with corresponding contacts in a rack connector (not shown) when the circuit board 10 is supported in a chassis assembly (not shown). Also carried on the front block 19 are a plurality of spring-loaded contacts 23 which are disposed on a block surface 24 oriented in a direction which is generally perpendicular to the direction in which the paddle contacts face. A plurality of contact pads are mounted on the surface of the connector block 19 which opposes the surface 24 on which the spring-loaded contacts 23 are mounted; each of the contact pads is associated with a respective spring-loaded contact 23. These pads are not shown in FIG. 1, but their disposition and spatial relationship to the paddle and spring-loaded contacts can be understood with reference to FIG. 2A, where one such contact pad, indicated by 25, is mounted on the front block surface 26 which opposes the surface 24. Two rows of spring-loaded contacts 27 are mounted on the back surface 28 of the front block 19 in a direction opposite that of the paddle contacts 21.

Figure 2A:
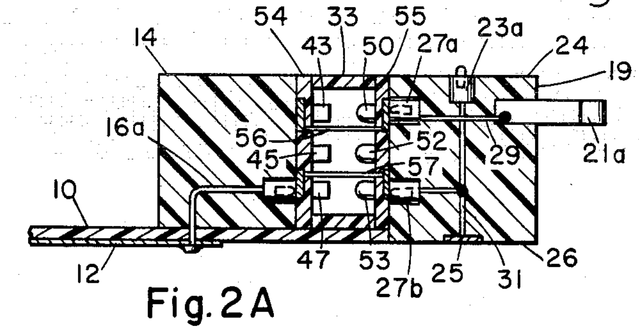
FIG. 2A is a side sectional view taken along line A—A of the assembled connector of FIG. 1 illustrating the physical interconnection of connector contacts, a conductive land, and a switching circuit.

FIG. 2A illustrates the interconnections which are provided in the dual-path connector to electrically link the contacts described above and the circuit lands on the circuit board 10. Although only one set of contacts, pads, and interconnections are shown in the Figure, it is to be understood that a plurality of other sets are identically linked. In FIG. 2A, a paddle contact 21*a* is connected to one of the rear spring-loaded contacts 27*a* by an electrical lead 29 which is internal to the connector front block 19. A spring-loaded contact 23*a* which is associated with a the contact pad 25 and the spring-loaded contact 27*b* is connected to them by an electrical connection 31 which is also internal to the front block.

With the arrangement of parts illustrated in FIGS. 1 and 2A, it is evident that the connector front block 19 possesses a dual-path capability, with one path including the paddle contacts 21 and another path, oriented perpendicularly to the paddle contact path, including the spring-loaded contacts 23 and their respective associated contact pads 25. To emphasize this feature, the spring-loaded contacts 23 are referred to hereinafter as 90° contacts. A spring-loaded contact 23 and its associated contact pad 25 is referred to as a 90° contact pair.

Figure 2B:
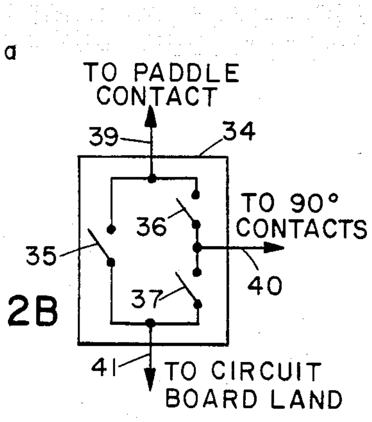
FIG. 2B is a schematic diagram representing the interconnection of a pair of connector contacts and a circuit board land by a switching circuit internal to the connector.

A thin rectangular switching assembly 33 is sandwiched between the rear block 14 and the front block 19 and carries a plurality of switching circuits, each of which is connected to a respective paddle contact, a respective 90° contact pair, and a respective circuit board land. A typical switching circuit 34, illustrated in FIG. 2B, includes three independently controlled switches 35, 36 and 37, which are operated to selectively connect conductive paths 39, 40 and 41. As indicated, the path 39 is connected to a paddle contact, the path 40 to a 90° contact, and the path 41 to a circuit board pin. In operation, the switch 35 can be closed while switches 36 and 37 remain open which provides conductivity between the paddle contact and, through its associated circuit connection pin, a circuit board land (and; through the land, an electrical circuit). Alternatively, the switch 36 can be closed while the switches 35 and 37 remain open, which provides conductivity between the paddle contact and the 90° contact pair. Finally, the switch 37 can be closed while switches 35 and 36 are open which will establish conductivity between the 90° contact pair and the circuit board land.

Figure 2C:
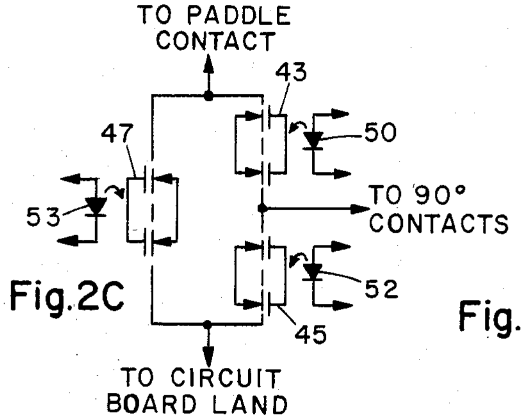
FIG. 2C is a schematic diagram illustrating one implementation of the circuit of FIG. 2B using transistorized circuitry.

One exemplary electronic implementation of the switch 34 is illustrated in FIG. 2C. In the circuit of FIG. 2C, a pair of optically-activated field effect transistors (FET's) 43 and 45 are connected in series between a paddle contact connection and a circuit board land connection, with the connection to the 90° contact pair connected between them. The FET's 43 and 45 are conventionally controlled by light-emitting diodes (LED's) 50 and 52, with either FET being activated when its associated LED is switched on. A third optically-controlled FET 47, controlled by LED 53, is connected in shunt across the FET's 43 and 45 and between the paddle contact connection and the circuit board land connection. In this circuit, when a selected FET is operated alone, conductivity can be selectively provided between the paddle and the 90° contacts or between the circuit board land and either the paddle contact of the 90° contacts.

Figure 2D:
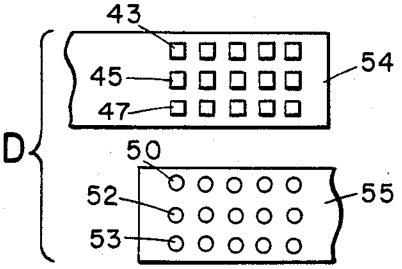
FIG. 2D is a partial plan view of two semiconductor carriers utilized to implement a plurality of switch circuits in the connector of FIG. 1.

One possible configuration for the semiconductor switching assembly 33 can be understood with reference to FIGS. 2A and 2D. The assembly 33 can include a pair of semiconductor carriers 54 and 55, with the FET's placed on the carrier 54, and LED's for controlling the FET's, on the carrier 55. The carriers 54 and 55 can comprise, for example, semiconductor substrates with the appropriate devices formed on their surfaces by conventional procedures. As illustrated in FIG. 2D, the FET's are arranged in a plurality of aligned columns, with each column providing the complement of three FET's necessary to form the switching circuit illustrated in FIG. 2C. Similarly, the LED's are formed in the substrate 55 in an equal number of columns, with each column providing the three LED's necessary to control three FET's in the manner described hereinabove. The carriers 54 and 55 are fastened together by conventional means, with the surfaces which carry the active devices disposed in a spaced, opposing .pa arrangement in which the columns of elements are aligned to provide the structure illustrated in FIG. 2A.

As presented in FIG. 2A, the column containing the LED's 50, 52 and 53 is arranged in an aligned, spaced relationship with the column containing the FET's 43, 45, and 47. The FET's are electrically connected as illustrated in FIG. 2C. In addition, the FET's 43, 45, and 47 are connected to the paddle contact 21*a* and 90° contacts 23*a* and 25*a* by means of conductive spacers 56 and 57 which establish conductivity between the spring-loaded contacts mounted on the back surface 28 which connect to the paddle and 90° contacts. The circuit pin 16*a* is connected by conventional means directly to the FET's 45 and 47 through the carrier 54.

Preferably, the switch circuits on the switching assembly 33 are operated in parallel so that each of the plurality of switches on the assembly 33 assumes the same operational configuration as every other switch. This limits the total amount of switching control hardware which is required to operate the switches. For example, the LED's which control similarly situated FET's in the circuits represented by FIG. 2C can be linked together so that, in all of the circuits, the same FET is activated at any one time. This will require only four control leads, three for the anodes of corresponding LED's, and one for the cathodes of all LED's. These control leads can be brought out to four of the paddle contacts on a connector and controlled by means external to the connector. It should be evident that the switching circuits on the switching assembly 33 can also be controlled individually so that the conductivity configuration between the three connections of any one switching circuit can be established independent of the configuration of any of the other circuits. This, however, would result in a proliferation of switch control leads and a concommitant decrease in the number of contacts available for transfer of signals between electrical circuits on the circuit board and their associated paddle and 90° contacts.

Figure 3:
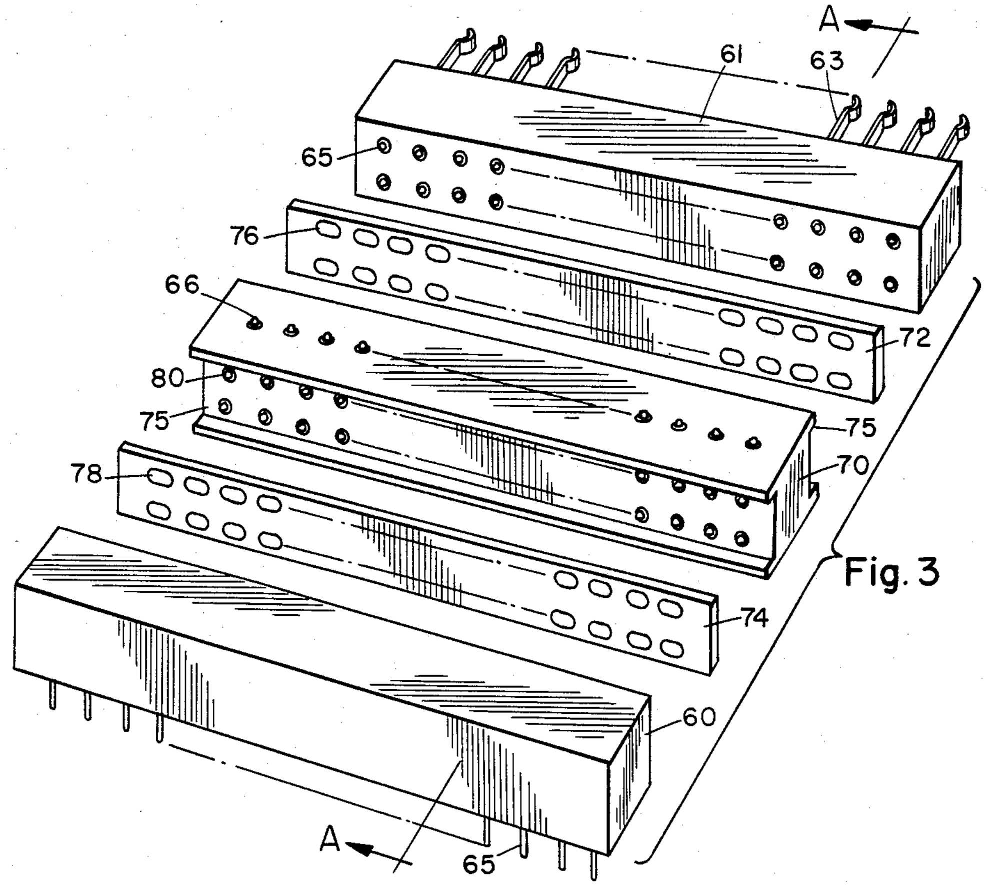
FIG. 3 is an exploded assembly drawing of a second embodiment of the connector of the invention wherein the internal switching is provided by sliding contact pads.

An alternate embodiment to that illustrated in FIG. 1 is shown in FIG. 3 and includes a connector rear block 60 and front block 61. The rear and front blocks 60 and 61 correspond substantially to the rear and front blocks 14 and 19 described hereinabove, and the front block 61 carries a plurality of paddle contacts 63 and a row of spring-loaded contacts 64 mounted and connected in substantially the same fashion as the contacts 21 and 23 of the FIG. 1 connector. Another row of contacts below the contacts 64 is associated with a row of paddle contacts, not shown, mounted below the paddle contacts 63. Similarly, the rear block 60 carries a plurality of circuit connector pins 65 mounted in its lower surface, each of which is connected to a spring-loaded contact, not shown, on the front surface of the rear block. The alternate embodiment also includes a plurality of spring-loaded contacts 66 mounted on the upper surface of a connector midblock 70, which is sandwiched between a pair of contact pad strips 72 and 74, which are slidably held between the rear and front blocks while enclosing the midblock 70. The rear and front blocks can be attached together by any conventional means with the sliding contact pad strips 72 and 74 and midblock 70 held therebetween. The contact pad strips can be held in sliding disposition within channels 75 formed in opposite sides of midblock 70. The contact strips can be reciprocally driven by any conventional means, for example, miniature solenoids or high-torque stepper motors. The midblock also carries on its lower surface a plurality of contact pads, not shown, each of which is connected to a respective one of the spring-loaded contacts 66 to form a 90° contact pair.

Each contact pad strip 72 and 74 carries a longitudinal row of conductive pads which comprise individual zones of electrically conductive material. The pads extend through the strip and are electrically insulated from one another. The numeral 76 indicates one row of contact pads on the strip 72, while the numeral 78 represents one row of pads on the strip 74.

Figure 4A:
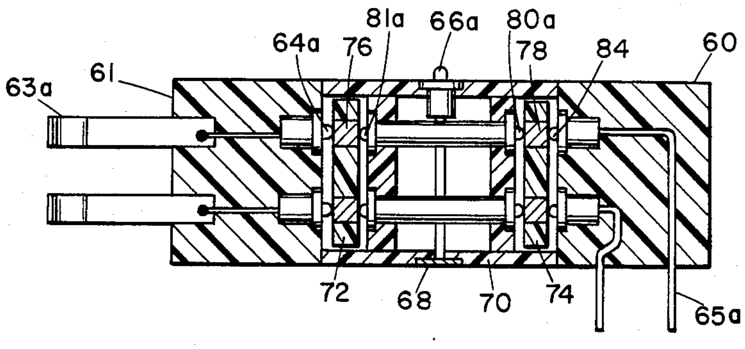
FIG. 4A is a sectional side view taken along line A—A of the assembled connector of FIG. 3 illlustrating the physical interconnection of contacts and the mechanical switching assembly.
Figure 4B:
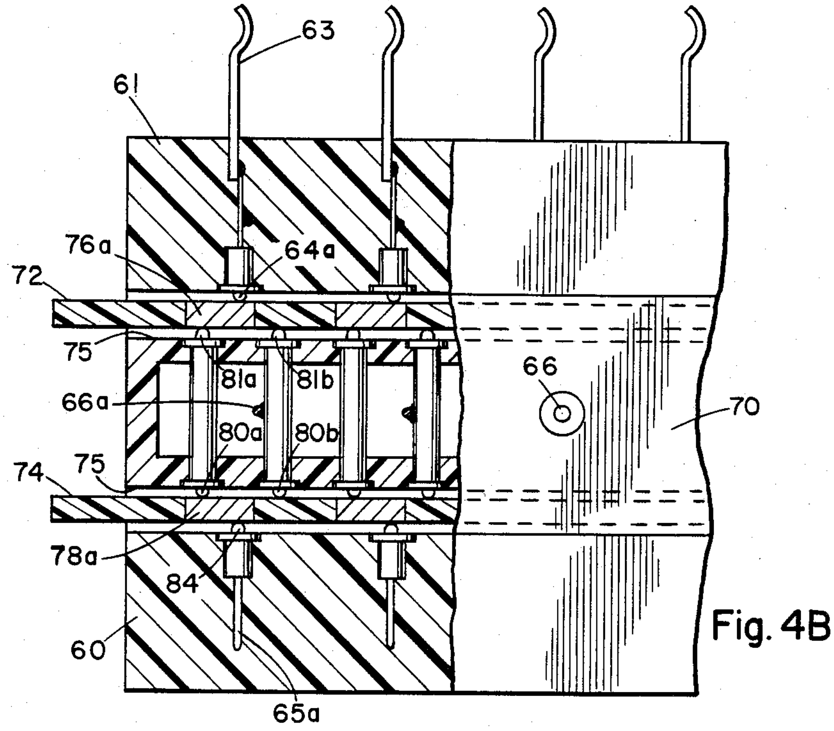
FIG. 4B is a partially cut-away top view of the assembled connector of FIG. 3.

The structure of an individual switch in the FIG. 3 embodiment of the connector of the invention can be understood with reference to FIGS. 4A and 4B, which illustrate the association and interconnections between one set of 90° contacts, one paddle contact, and one circuit connection pin, it being understood that these figures are representative of a plurality of such interconnections in the connector. The 90° contacts comprise a spring-loaded contact 66*a* and an associated contact pad 68, and are mounted on opposing surfaces of the midblock 70 in electrical connection therethrough. As shown in FIG. 3, the midblock 70 also carries two rows of spring-loaded contacts perpendicularly to the 90° contacts; one row is indicated by 80; two other rows, not shown, of spring-loaded contacts are carried on the opposte face of the midblock 70. Each contact 80 is connected to a contact on the opposite face to form a set therewith; the plurality of contact sets are associated in pairs. This is exemplified in FIGS. 4A and 4B where contacts 80*a* and 81*a* are paired with contacts 80*b* and 81*b*. Further, one of the paired sets of contacts is connected to a set of 90° contacts; this is shown, for example, in FIG. 4B where the contact 66*a* is connected to the contact set including contacts 80*b* and 81*b*. The contacts, 80*a* and *b*, and the contacts 81*a* and i b, are spaced apart at a distance which is greater than the length of a conductive pad. The contact 64*a* on the rear of the front block 61 which is connected to the paddle contact 63*a* is located opposite contacts 80*a* and 81*a* and midway therebetween. Similarly, a spring-loaded contact 84 which is mounted in the front surface of the rear block 60 and in electrical contact with the circuit connector pin 64*a* is positioned opposite and midway between the contacts 80*b* and 81*b*.

When the connector of FIG. 3 is assembled, the contacts 80*a*, 81*a* and 65*a* physically touch the sliding contact strip 72 while the contacts 80*b*, 81*b* and 84 contact the sliding contact pad strip 74. In operation, each of the sliding strips 72 and 74 can be independently placed in one of two positions. In the first position of the strip 72, the conductive pad 76*a* is positioned to be in contact with the contacts 80*a* and 64*a* to provide electrical connection between them. In the second position of the contact pad strip 72, the conductive pad 76*a* is positioned to provide conductivity between the contacts 81*a* and 64*a*. Similarly, in the first position of the contact strip 74, the contact pad 78*a* is positioned to connect the contact 80*b* and 84*a* while in the second position of the strip 74 the contact pad 78*a* establishes electrical contact between the contacts 81*b* and 84. Thus, with both sliding strips in their first position, conductivity is provided between the paddle contact 63*a* and the circuit connector pin 65*a*. With the sliding strip 72 in its second position and the sliding strip 74 in its first position, conductivity exists between the paddle contact 63*a* and the 90° contacts 66*a* and 68. Finally, with the sliding strip 72 in its first position and the sliding strip 74 in its second position, there is conductivity between circuit connector pin 65*a* and the 90° contacts 66*b* and 68.

Both embodiments of the dual-path connector are assembled by conventional means, for example, machine screws and threaded plugs. Either embodiment is then conventionally secured to a circuit board so that the paddle contacts are substantially aligned with an edge of the board and parallel to its surface. The circuit connection pins are soldered to corresponding respective conductive lands on the board.

Figure 5:
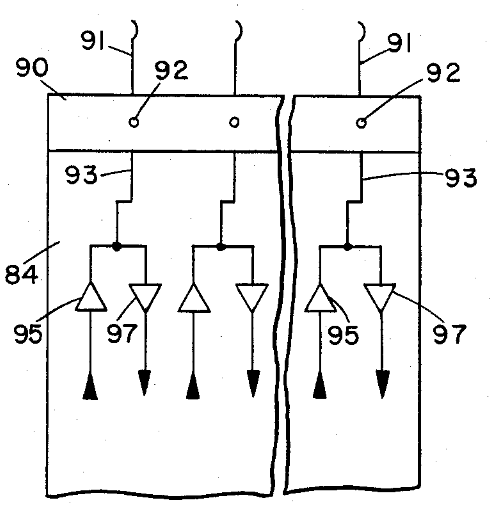
FIG. 5 is a plan view of the connector of the invention mounted on a printed circuit board.

One possible application environment of either embodiment of the invention is illustrated in FIG. 5 where a circuit board 84 has mounted on it a connector 90 having a plurality of switches which operate as described above to selectively provide .pa conductivity between a plurality of paddle contacts 91, a plurality of 90° contacts 92, and a plurality of circuit connections 93. In the illustrated example, each circuit connection 93 is connected to a respective land combining the output of a line driver 95 and a line receiver 97. Operation of the switches to provide conductivity between the paddle contacts 91 and the circuit connections 93 can enable all of the line drivers 95, for example, to simultaneously provide signals to the paddle contacts 91. This configuration can be used to read the output of a multi-bit data buffer, not shown. Operation of the switching circuits to provide conductivity between the 90° contacts 92 and the circuit connection pins 93 can be used, for example, to read a plurality of data bits in parallel into the multi-bit buffer, through the line receivers 97, from a location separate from the data output destination.

Figure 6:
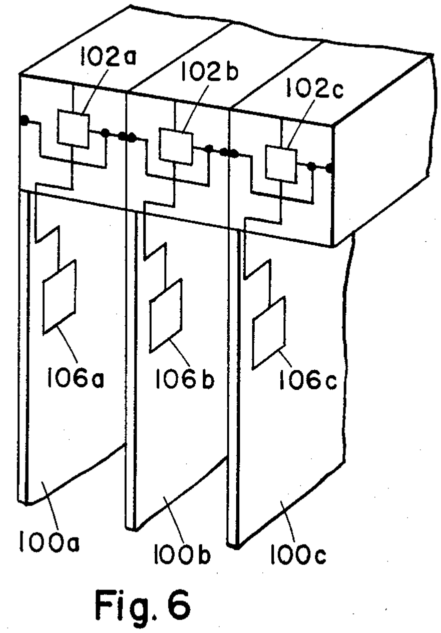
FIG. 6 is an isometric view of three adjacent connectors illustrating how the connector of the invention is used to form a bus.

FIG. 6 illustrates another operative example of the connector of the invention. A plurality of printed circuit boards 100*a, b,* and *c,* with dual-path connectors 102*a, b,* and *c,* respectively, mounted thereto, are disposed in an aligned, abutting relationship so that spring-loaded 90° contacts of one connector contact 90° contact pads of an adjacent connector, thus forming an electrical bus to which a plurality of electrical circuits 106*a, b,* and *c* may be connected by the simultaneous operation of the switches in the dual-path connectors 102*a, b,* and *c.* The different operational modes which are made possible by the aligned, abutting relationship illustrated in FIG. 6 can be understood with reference to FIGS. 7A–7C.

Figure 7A:
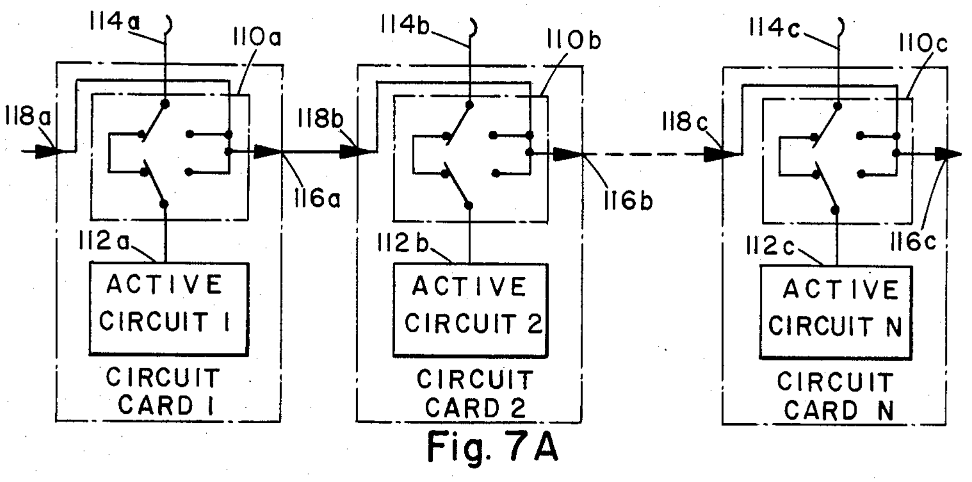
FIG. 7A is a functional block diagram illustrating a normal operation mode for a plurality of adjacent dual-path connectors.

In FIG. 7A, each of a plurality of dual-path connector switches 110*a, b,* and *c* in respective dual-path connectors mounted on circuit cards 1, 2, and 3, respectively, are connected to a respective one of the active circuits 112*a, b,* and *c,* a respective one of the paddle contacts 114*a, b,* and *c,* and a respective one of the 90° contact pairs consisting of spring-loaded contacts 116*a, b,* and *c,* and contact pads 118*a, b,* and *c.* The circuit cards upon which the dual-path connectors are mounted are aligned as illustrated in FIG. 6 so that the spring-loaded 90° contacts of each dual-path connector contact the 90° contact pads of an adjacent connector. This provides a busing arrangement linking the aligned 90° contact pairs of the plurality of circuit cards. FIG. 7A illustrates what may be termed a "normal" operation mode wherein all of the switches 110*a, b,* and *c* are operated to connect their respective associated active circuits with their respective associated paddle contacts. This provides a direct path between the active circuits 112*a, b,* and *c,* and its associated paddle contact, and permits each electrical circuit to be independently connected to a different location.

Figure 7B:
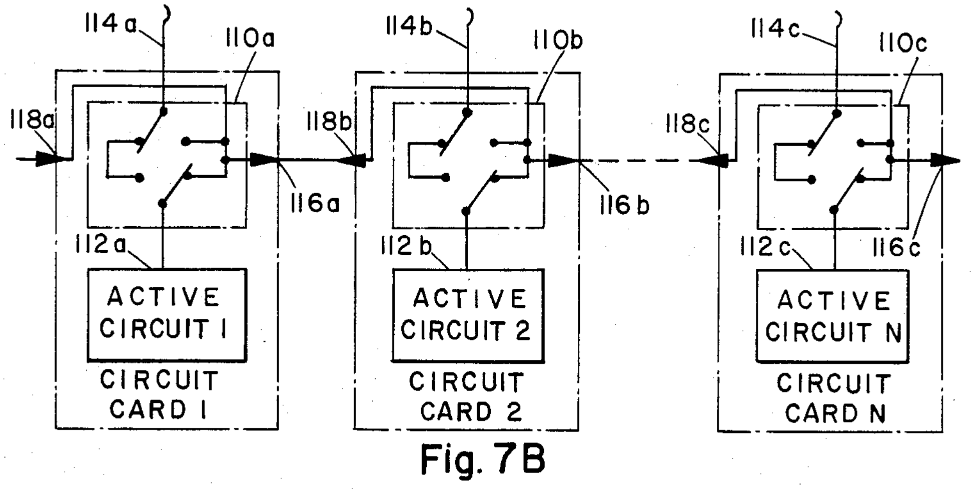
FIG. 7B is a schematic diagram illustrating a first alternate operating mode for a plurality of adjacent dual-path connectors.

A "busing" mode is illustrated in FIG. 7B. A single-path bus consisting of the aligned 90° contact pairs of the adjacent connectors enables all of the electrical circuits 112*a, b,* and *c* to be connected through their respective 90° contact pairs to a single, common point. This mode of operation can be used, for example, for conventional bussing, for mutual communication between the electrical circuits 112*a, b,* and *c,* or for the establishment of a common testing mode for the circuits without the need for an external testing adaptor.

Figure 7C:
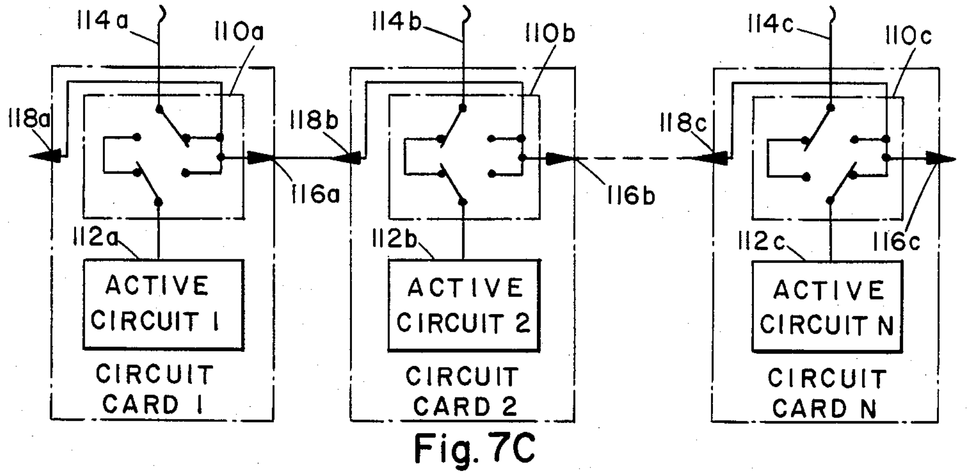
FIG. 7C is functional block diagram illustrating another alternative operating mode for a plurality of adjacent dual-path connectors.

Finally, FIG. 7C illustrates what may be termed a "circuit substitution" mode of operation. In this mode, the switch 110*a* in the dual-path connector of circuit card 1 is operated to connect the paddle contact 114*a* through its associated 90° contacts 116*a* and 118*a* to the common bus which is formed by the aligned juxtaposition of the 90° contacts of the adjacent circuit cards. In this configuration, the switch 110*a* effectively removes the electrical circuit 112*a* from any external contact through either the 90° contacts or the paddle contact 114*a*. At the same time, the switch 110*c* in the dual-path connector of circuit card 3 is operated to connect the electrical circuit 112*c* to the 90° contacts 116*c* and 118*c*. All of the switches on the dual-path connectors of circuit card 6 located between the circuit cards 1 and 3 are operated to connect their respective associated electrical circuits with their respective associated paddle contacts. Thus, the paddle contact 114*a* can access the electrical circuit 112*c* directly through the common bus established through the aligned 90° contact pairs of the juxtaposed dual-path connectors. This permits the circuit 112*c* to be substituted for the circuit 112*a* when, for example, the circuit 112*a* malfunctions.

It is to be understood that although the bussing arrangement illustrated in FIGS. 6 and 7A–7C is presented in terms of only a single bus which accesses a single sequence of circuits through a plurality of aligned 90° contact pairs, a plurality of similarly constructed busses can be operated in parallel through the dual-path connectors.

Further, it should be evident that a multi-path connector may be constructed having internal switching means which selectively provides conductivity through or between more than two groups of contacts.

Thus, the foregoing description provides a disclosure of a dual-path connector having a plurality of groups of electrical contacts and an internal switching apparatus which permits electrical circuits on a printed circuit card to be selectively connected to respective contacts in either group of contacts, thereby affording the connector the ability to selectively route electrical paths between those circuits and other locations connected to the groups of contacts.

Obviously, many modifications and variations are possible in light of the above teachings, and it is therefore understood that the invention may be practiced otherwise than as specifically described.

What is claimed is:

1. A connector for selectively providing connections to a plurality of electrical circuits, comprising:

(a) a plurality of connector contacts for being engaged to form electrical connections;

(b) means for carrying said connector contacts; and (c) switching means mounted in said carrying means and connected to said connector contacts and to associated electrical circuits for selectively providing connections between at least a pair of said connector contacts or between at least one of said electrical circuits and either contact of said pair.

2. The connector of claim 1 wherein said switching means comprises a plurality of switches and each said switch has a connection to a respective one of said electrical circuits, a connection to a first respective connector contact, and a connection to a second respective connector contact and includes means for selectively providing conductivity between any two of said connections.

3. The connector of claim 2 wherein said connector contacts form at least two predetermined contact groups, one said contact group including said first respective contacts and another said contact group including said second respective contacts.

4. The connector of claim 2 wherein said electrical circuits are mounted on an electric circuit board and said carrying means comprises a multipin connector housing mounted on said board.

5. The connector of claim 4 wherein said first respective contacts are oriented on said housing to be engaged from one direction and said second respective contacts are oriented on said housing to be engaged from another direction.

6. The connector of claim 5 wherein said housing is an elongate housing mounted adjacent an edge of said circuit board and said directions are substantially perpendicular to one another.

7. The connector of claim 5 wherein said second respective contacts are disposed to be engaged by a corresponding set of contacts of another connector adjacent said connector.

8. The connector of claim 7 wherein said circuit board is disposed adjacent another circuit board carrying said other connector.

9. A system for selectively routing signals through and between a plurality of adjacent electrical circuit modules, comprising:

(a) connector means mounted on each said module for carrying a plurality of groups of connector contacts which can be engaged to form electrical connections, wherein a first group of contacts is oriented on said connector means to be engaged from a first direction and a second group of contacts is oriented on said connector means to be engaged from a second direction; and (b) switching means mounted in said connector means and connected to said two groups of contacts and to one or more electrical circuits carried by said module for selectively providing connections between at least a pair of said connector contacts each included in a respective group or between either contact of said pair and an electrical circuit.

10. The system of claim 9 wherein said second group of contacts is oriented to be engaged by contacts carried on a connector means mounted on an adjacent module.

11. The system of claim 10 wherein each said connector means further carries a third group of connector contacts oriented to be engaged from a third direction by contacts carried on another adjacent module and each of said third group of contacts is connected to a respective contact of said second group.

12. The system of claim 11 wherein said modules comprise rack-mounted electronic circuit boards.

13. The system of claim 12 wherein each said connector comprises an elongate connector body mounted adjacent an edge of a respective circuit board and said directions are substantially parallel to said edge.

14. The system of claim 11 wherein said switching means includes a plurality of switches and each said switch has a connection to a respective contact of said first group, a connection to respective connected contacts of said second and third groups, and a connection to a respective electronic circuit and includes means for selectively providing conductivity between any two of said connections.

* * * * *